United States Patent
Byun et al.

(10) Patent No.: US 9,661,538 B2
(45) Date of Patent: May 23, 2017

(54) METHOD AND APPARATUS FOR DETERMINING HANDOVER OF USER EQUIPMENTS ATTACHED TO MOBILE RELAY NODE IN WIRELESS COMMUNICATION SYSTEM

(71) Applicant: LG ELECTRONICS INC., Seoul (KR)

(72) Inventors: Daewook Byun, Anyang-si (KR); Jian Xu, Anyang-si (KR); Kyungmin Park, Anyang-si (KR)

(73) Assignee: LG ELECTRONICS INC., Seoul (KR)

(*) Notice: Subject to any disclaimer, the term of this patent is extended or adjusted under 35 U.S.C. 154(b) by 64 days.

(21) Appl. No.: 14/378,293

(22) PCT Filed: Mar. 11, 2013

(86) PCT No.: PCT/KR2013/001918
§ 371 (c)(1),
(2) Date: Aug. 12, 2014

(87) PCT Pub. No.: WO2013/137600
PCT Pub. Date: Sep. 19, 2013

(65) Prior Publication Data
US 2015/0016334 A1    Jan. 15, 2015

Related U.S. Application Data

(60) Provisional application No. 61/611,534, filed on Mar. 15, 2012.

(51) Int. Cl.
*H04W 36/08* (2009.01)
*H04W 88/04* (2009.01)
(Continued)

(52) U.S. Cl.
CPC .......... *H04W 36/08* (2013.01); *H04W 88/04* (2013.01); *H04W 84/005* (2013.01); *H04W 84/047* (2013.01)

(58) Field of Classification Search
CPC ..... H04W 36/08; H04W 88/04; H04W 36/38; H04W 2/38; H04W 36/00
See application file for complete search history.

(56) References Cited

U.S. PATENT DOCUMENTS

| | | | |
|---|---|---|---|
| 2008/0125125 A1* | 5/2008 | Choi | H04W 36/0083 455/436 |
| 2009/0186645 A1* | 7/2009 | Jaturong | H04L 5/0007 455/507 |

(Continued)

OTHER PUBLICATIONS

3rd Generation Partnership Project (3GPP), "Technical Specification Group Radio Access Network; Evolved Universal Terrestrial Radio Access (E-UTRA); Relay architectures for E-UTRA (LTE-Advanced) (Release 9)," 3GPP TR 36.806 V9.0.0, Mar. 2010, 35 pages.

(Continued)

*Primary Examiner* — Anez Ebrahim
(74) *Attorney, Agent, or Firm* — Lee Hong Degerman Kang & Waimey

(57) ABSTRACT

A method for determining handover of user equipments (UEs) attached to the mobile relay node, which performs a handover procedure from a source donor eNodeB (DeNB) to a target DeNB, in a wireless communication system is provided. A mobile relay node (RN) receives an indication including information on assignable resources for the RN, and determines whether to accept or reject the handover of each UE using the received indication and contexts of the UEs stored in the mobile relay node.

13 Claims, 14 Drawing Sheets

(51) Int. Cl.
　　　*H04W 84/00*　　　(2009.01)
　　　*H04W 84/04*　　　(2009.01)

(56) References Cited

U.S. PATENT DOCUMENTS

| | | | | |
|---|---|---|---|---|
| 2010/0046476 A1* | 2/2010 | Qiu | ................... | H04W 36/02 |
| | | | | 370/331 |
| 2011/0002306 A1* | 1/2011 | Liu | ................ | H04W 36/0033 |
| | | | | 370/331 |

OTHER PUBLICATIONS

3rd Generation Partnership Project (3GPP), "Technical Specification Group Services and System Aspects; Telecommunication management; Performance Management (PM); Performance measurements Evolved Universal Terrestrial Radio Access Network (E-UTRAN) (Release 11)," 3GPP TS 32.425, V11.1.0, Dec. 2011, 67 pages.

3rd Generation Partnership Project (3GPP), "Technical Specification Group Radio Access Network; Evolved Universal Terrestrial Radio Access (E-UTRA) and Evolved Universal Terrestrial Radio Access Network (E-UTRAN); Overall description; Stage 2 (Release 10)," 3GPP TS 36.300 V10.3.0, Mar. 2011, 198 pages.

PCT International Application No. PCT/KR2013/001918, Written Opinion of the International Searching Authority dated Jul. 1, 2013, 1 page.

* cited by examiner (a)

(b)

METHOD AND APPARATUS FOR DETERMINING HANDOVER OF USER EQUIPMENTS ATTACHED TO MOBILE RELAY NODE IN WIRELESS COMMUNICATION SYSTEM

CROSS-REFERENCE TO RELATED APPLICATIONS

This application is the National Stage filing under 35 U.S.C. 371 of International Application No. PCT/KR2013/001918, filed on Mar. 11, 2013, which claims the benefit of U.S. Provisional Application Ser. No. 61/611,534, filed on Mar. 15, 2012, the contents of which are hereby incorporated by reference herein in their entirety.

BACKGROUND OF THE INVENTION

Field of the Invention

The present invention relates to wireless communication, and more particularly, to a method and apparatus for determining handover of user equipments attached to a mobile relay node in a wireless communication system.

Related Art

Universal mobile telecommunications system (UMTS) is a 3rd generation (3G) asynchronous mobile communication system operating in wideband code division multiple access (WCDMA) based on European systems, global system for mobile communications (GSM) and general packet radio services (GPRS). The long-term evolution (LTE) of UMTS is under discussion by the 3rd generation partnership project (3GPP) that standardized UMTS.

The 3GPP LTE is a technology for enabling high-speed packet communications. Many schemes have been proposed for the LTE objective including those that aim to reduce user and provider costs, improve service quality, and expand and improve coverage and system capacity. The 3GPP LTE requires reduced cost per bit, increased service availability, flexible use of a frequency band, a simple structure, an open interface, and adequate power consumption of a terminal as an upper-level requirement.

FIG. 1 shows network structure of an evolved universal mobile telecommunication system (E-UMTS). The E-UMTS may be also referred to as an LTE system. The communication network is widely deployed to provide a variety of communication services such as voice over internet protocol (VoIP) through IMS and packet data.

As illustrated in FIG. 1, the E-UMTS network includes an evolved UMTS terrestrial radio access network (E-UTRAN), an evolved packet core (EPC) and one or more user equipment. The E-UTRAN may include one or more evolved NodeB (eNB) 20, and a plurality of user equipment (UE) 10. One or more E-UTRAN mobility management entity (MME)/system architecture evolution (SAE) gateways (S-GW) 30 may be positioned at the end of the network and connected to an external network.

As used herein, "downlink" refers to communication from eNB 20 to UE 10, and "uplink" refers to communication from the UE to an eNB. UE 10 refers to communication equipment carried by a user and may be also referred to as a mobile station (MS), a user terminal (UT), a subscriber station (SS) or a wireless device.

An eNB 20 provides end points of a user plane and a control plane to the UE 10. MME/S-GW 30 provides an end point of a session and mobility management function for UE 10. The eNB and MME/S-GW may be connected via an S1 interface.

The eNB 20 is generally a fixed station that communicates with a UE 10, and may also be referred to as a base station (BS) or an access point. One eNB 20 may be deployed per cell. An interface for transmitting user traffic or control traffic may be used between eNBs 20.

The MME provides various functions including non-access stratum (NAS) signaling to eNBs 20, NAS signaling security, access stratum (AS) security control, Inter core network (CN) node signaling for mobility between 3GPP access networks, Idle mode UE reachability (including control and execution of paging retransmission), tracking area list management (for UE in idle and active mode), packet data network (PDN) GW and serving GW selection, MME selection for handovers with MME change, serving GPRS support node (SGSN) selection for handovers to 2G or 3G 3GPP access networks, roaming, authentication, bearer management functions including dedicated bearer establishment, support for public warning system (PWS) (which includes earthquake and tsunami warning system (ETWS) and commercial mobile alert system (CMAS)) message transmission. The S-GW host provides assorted functions including per-user based packet filtering (by e.g. deep packet inspection), lawful interception, UE internet protocol (IP) address allocation, transport level packet marking in the downlink, UL and DL service level charging, gating and rate enforcement, DL rate enforcement based on APN-AMBR. For clarity MME/S-GW 30 will be referred to herein simply as a "gateway," but it is understood that this entity includes both an MME and an SAE gateway.

A plurality of nodes may be connected between eNB 20 and gateway 30 via the S1 interface. The eNBs 20 may be connected to each other via an X2 interface and neighboring eNBs may have a meshed network structure that has the X2 interface.

FIG. 2 shows architecture of a typical E-UTRAN and a typical EPC.

As illustrated, eNB 20 may perform functions of selection for gateway 30, routing toward the gateway during a radio resource control (RRC) activation, scheduling and transmitting of paging messages, scheduling and transmitting of broadcast channel (BCH) information, dynamic allocation of resources to UEs 10 in both uplink and downlink, configuration and provisioning of eNB measurements, radio bearer control, radio admission control (RAC), and connection mobility control in LTE_ACTIVE state. In the EPC, and as noted above, gateway 30 may perform functions of paging origination, LTE_IDLE state management, ciphering of the user plane, SAE bearer control, and ciphering and integrity protection of NAS signaling.

FIG. 3 shows a user-plane protocol and a control-plane protocol stack for the E-UMTS.

FIG. 3(a) is block diagram depicting the user-plane protocol, and FIG. 3(b) is block diagram depicting the control-plane protocol. As illustrated, the protocol layers may be divided into a first layer (L1), a second layer (L2) and a third layer (L3) based upon the three lower layers of an open system interconnection (OSI) standard model that is well known in the art of communication systems.

The physical layer, the L1, provides an information transmission service to an upper layer by using a physical channel. The physical layer is connected with a medium access control (MAC) layer located at a higher level through a transport channel, and data between the MAC layer and the physical layer is transferred via the transport channel. Between different physical layers, namely, between physical layers of a transmission side and a reception side, data is transferred via the physical channel.

The MAC layer of the L2 provides services to a radio link control (RLC) layer (which is a higher layer) via a logical channel. The RLC layer of the L2 supports the transmission of data with reliability. It should be noted that the RLC layer illustrated in FIGS. 3(a) and 3(b) is depicted because if the RLC functions are implemented in and performed by the MAC layer, the RLC layer itself is not required. A packet data convergence protocol (PDCP) layer of the L2 performs a header compression function that reduces unnecessary control information such that data being transmitted by employing IP packets, such as IPv4 or IPv6, can be efficiently sent over a radio (wireless) interface that has a relatively small bandwidth.

A radio resource control (RRC) layer located at the lowest portion of the L3 is only defined in the control plane and controls logical channels, transport channels and the physical channels in relation to the configuration, reconfiguration, and release of the radio bearers (RBs). Here, the RB signifies a service provided by the L2 for data transmission between the terminal and the UTRAN.

As illustrated in FIG. 3(a), the RLC and MAC layers (terminated in an eNB 20 on the network side) may perform functions such as scheduling, automatic repeat request (ARQ), and hybrid automatic repeat request (HARQ). The PDCP layer (terminated in eNB 20 on the network side) may perform the user plane functions such as header compression, integrity protection, and ciphering.

As illustrated in FIG. 3(b), the RLC and MAC layers (terminated in an eNodeB 20 on the network side) perform the same functions for the control plane. As illustrated, the RRC layer (terminated in an eNB 20 on the network side) may perform functions such as broadcasting, paging, RRC connection management, RB control, mobility functions, and UE measurement reporting and controlling. The NAS control protocol (terminated in the MME of gateway 30 on the network side) may perform functions such as a SAE bearer management, authentication, LTE_IDLE mobility handling, paging origination in LTE_IDLE, and security control for the signaling between the gateway and UE 10.

The RRC state may be divided into two different states such as a RRC_IDLE and a RRC_CONNECTED. In RRC_IDLE state, the UE 10 may receive broadcasts of system information and paging information while the UE specifies a discontinuous reception (DRX) configured by NAS, and the UE has been allocated an identification (ID) which uniquely identifies the UE in a tracking area and may perform PLMN selection and cell re-selection. Also, in RRC_IDLE state, no RRC context is stored in the eNB.

In RRC_CONNECTED state, the UE 10 has an E-UTRAN RRC connection and a context in the E-UTRAN, such that transmitting and/or receiving data to/from the network (eNB) becomes possible. Also, the UE 10 can report channel quality information and feedback information to the eNB.

In RRC_CONNECTED state, the E-UTRAN knows the cell to which the UE 10 belongs. Therefore, the network can transmit and/or receive data to/from UE 10, the network can control mobility (handover and inter-radio access technologies (RAT) cell change order to GSM EDGE radio access network (GERAN) with network assisted cell change (NACC)) of the UE, and the network can perform cell measurements for a neighboring cell.

In RRC_IDLE state, the UE 10 specifies the paging DRX cycle. Specifically, the UE 10 monitors a paging signal at a specific paging occasion of every UE specific paging DRX cycle.

The paging occasion is a time interval during which a paging signal is transmitted. The UE 10 has its own paging occasion.

A paging message is transmitted over all cells belonging to the same tracking area. If the UE 10 moves from one tracking area to another tracking area, the UE will send a tracking area update message to the network to update its location.

FIG. 4 shows an example of structure of a physical channel.

The physical channel transfers signaling and data between layer L1 of a UE and eNB. As illustrated in FIG. 4, the physical channel transfers the signaling and data with a radio resource, which consists of one or more sub-carriers in frequency and one more symbols in time.

One sub-frame, which is 1 ms in length, consists of several symbols. The particular symbol(s) of the sub-frame, such as the first symbol of the sub-frame, can be used for downlink control channel (PDCCH). PDCCHs carry dynamic allocated resources, such as PRBs and modulation and coding scheme (MCS).

A transport channel transfers signaling and data between the L1 and MAC layers. A physical channel is mapped to a transport channel.

Downlink transport channel types include a broadcast channel (BCH), a downlink shared channel (DL-SCH), a paging channel (PCH) and a multicast channel (MCH). The BCH is used for transmitting system information. The DL-SCH supports HARQ, dynamic link adaptation by varying the modulation, coding and transmit power, and both dynamic and semi-static resource allocation. The DL-SCH also may enable broadcast in the entire cell and the use of beamforming. The PCH is used for paging a UE. The MCH is used for multicast or broadcast service transmission.

Uplink transport channel types include an uplink shared channel (UL-SCH) and random access channel(s) (RACH). The UL-SCH supports HARQ and dynamic link adaptation by varying the transmit power and potentially modulation and coding.

The UL-SCH also may enable the use of beamforming The RACH is normally used for initial access to a cell.

The MAC sublayer provides data transfer services on logical channels. A set of logical channel types is defined for different data transfer services offered by MAC. Each logical channel type is defined according to the type of information transferred.

Logical channels are generally classified into two groups. The two groups are control channels for the transfer of control plane information and traffic channels for the transfer of user plane information.

Control channels are used for transfer of control plane information only. The control channels provided by MAC include a broadcast control channel (BCCH), a paging control channel (PCCH), a common control channel (CCCH), a multicast control channel (MCCH) and a dedicated control channel (DCCH). The BCCH is a downlink channel for broadcasting system control information. The PCCH is a downlink channel that transfers paging information and is used when the network does not know the location cell of a UE. The CCCH is used by UEs having no RRC connection with the network. The MCCH is a point-to-multipoint downlink channel used for transmitting MBMS control information from the network to a UE. The DCCH is a point-to-point bi-directional channel used by UEs having an RRC connection that transmits dedicated control information between a UE and the network.

Traffic channels are used for the transfer of user plane information only. The traffic channels provided by MAC include a dedicated traffic channel (DTCH) and a multicast traffic channel (MTCH). The DTCH is a point-to-point channel, dedicated to one UE for the transfer of user information and can exist in both uplink and downlink. The MTCH is a point-to-multipoint downlink channel for transmitting traffic data from the network to the UE.

Uplink connections between logical channels and transport channels include a DCCH that can be mapped to UL-SCH, a DTCH that can be mapped to UL-SCH and a CCCH that can be mapped to UL-SCH. Downlink connections between logical channels and transport channels include a BCCH that can be mapped to BCH or DL-SCH, a PCCH that can be mapped to PCH, a DCCH that can be mapped to DL-SCH, and a DTCH that can be mapped to DL-SCH, a MCCH that can be mapped to MCH, and a MTCH that can be mapped to MCH.

3GPP LTE-A may supports relaying by having a relay node (RN) wirelessly connect to an eNB serving the RN. It may be referred to paragraph 4.7 of 3rd generation partnership project (3GPP) TS 36.300 V10.2.0 (2010-12).

FIG. 5 shows an objective of relay.

Referring to FIG. 5, a relay node (RN) wirelessly communicates with an eNB supporting relay, and thus can support capacity assistance of a shadow region or coverage extension through a service for UEs located in a cell boundary region and outside the boundary region. The eNB serving the RN may be referred as a donor eNB (DeNB). The DeNB requires several additional functions for supporting relay. When there is an access of the relay node, the DeNB can perform a reconfiguration task to provide information required for relay and system information through dedicated signaling. The DeNB and the RN may be connected via a modified version of the E-UTRA radio interface. The modified version may be referred as a Un interface.

The RN may support eNB functionality. It means that the RN terminates the radio protocols of the E-UTRA radio interface, and S1 and X2 interfaces. In addition to the eNB functionality, the RN may also support a subset of UE functionality, e.g., a physical layer, layer-2, RRC, and NAS functionality, in order to wirelessly connect to the DeNB. That is, the relay node can operate as a relay-type UE with respect to the DeNB, and can operate as an eNB with respect to a served UE.

FIG. 6 shows an overall E-UTRAN architecture supporting relay nodes.

Referring to FIG. 6, the LTE-A network includes an E-UTRAN, an EPC and one or more user equipment (not described). The E-UTRAN may include one or more relay node (RN) 50, one or more DeNB 60, one or more eNB 61 and a plurality of UE may be located in one cell. One or more E-UTRAN MME/S-GW 70 may be positioned at the end of the network and connected to an external network.

As used herein, "downlink" refers to communication from the eNB 61 to the UE, from the DeNB 60 to the UE or from the RN 50 to the UE, and "uplink" refers to communication from the UE to the eNB 61, from the UE to the DeNB 60 or from the UE to the RN 50. The UE refers to communication equipment carried by a user and may be also referred to as a mobile station (MS), a user terminal (UT), a subscriber station (SS) or a wireless device.

The eNB 61 and the DeNB 60 provide end points of a user plane and a control plane to the UE. The MME/S-GW 70 provides an end point of a session and mobility management function for UE. The eNB 61 and the MME/S-GW 70 may be connected via an S1 interface. The DeNB 60 and MME/SAE gateway 70 may be connected via an S1 interface. The eNBs 61 may be connected to each other via an X2 interface and neighboring eNBs may have a meshed network structure that has the X2 interface. The eNB 61 and the DeNB 60 may be connected to each other via an X2 interface.

The RN 50 may be wirelessly connected to the DeNB 60 via a modified version of the E-UTRA radio interface being called the Un interface. That is, the RN 50 may be served by the DeNB 60. The RN 50 may support the eNB functionality which means that it terminates the S1 and X2 interfaces. Functionality defined for the eNB 61 or the DeNB 60, e.g. radio network layer (RNL) and transport network layer (TNL), may also apply to RNs 50. In addition to the eNB functionality, the RN 50 may also support a subset of the UE functionality, e.g. physical layer, layer-2, RRC, and NAS functionality, in order to wirelessly connect to the DeNB 60.

The RN 50 may terminate the S1, X2 and Un interfaces. The DeNB 60 may provide S1 and X2 proxy functionality between the RN 50 and other network nodes (other eNBs, MMEs and S-GWs). The S1 and X2 proxy functionality may include passing UE-dedicated S1 and X2 signaling messages as well as GTP data packets between the S1 and X2 interfaces associated with the RN 50 and the S1 and X2 interfaces associated with other network nodes. Due to the proxy functionality, the DeNB 60 appears as an MME (for S1) and an eNB (for X2) to the RN 50.

The DeNB 60 may also embed and provides the S-GW/P-GW-like functions needed for the RN operation. This includes creating a session for the RN 50 and managing EPS bearers for the RN 50, as well as terminating the S11 interface towards the MME serving the RN 50.

The RN 50 and the DeNB 60 may also perform mapping of signaling and data packets onto EPS bearers that are setup for the RN. The mapping may be based on existing QoS mechanisms defined for the UE and the P-GW.

The relay node may be classified to a fixed relay node and a mobile relay node. The mobile relay node may be applied to the 3GPP LTE rel-11. One of the possible deployment scenarios of mobile relay node is high speed public transportation, e.g., a high speed railway. That is, the mobile relay node may be put on the top of a high speed train. Hence, it is easily expected that the provision of various good quality services towards the users on a high speed public transportation will be important. Meanwhile, the service requirements offered by the fixed relay node seem to be different from those offered by the mobile relay node. So, there might be a few of considerations that should be resolved in the mobile relay node. The solutions to resolve these considerations for mobile relay node may have impacts on a radio access network (RAN).

FIG. 7 shows an example of deployments scenario of mobile relay node at a high speed train.

Referring to FIG. 7, a mobile relay node is installed in a high speed train. A coverage of the mobile relay node may correspond to the entirety of the high speed train or each of cars constituting the high speed train. The mobile relay node can communicate with UEs in the high speed train through an access link. At present, the mobile relay node is in a coverage of an eNB1 supporting relay. The mobile relay node can communicate with the eNB1 through a backhaul link. When the high speed train moves, the mobile relay node may enter a coverage of an eNB2 supporting relay. Accordingly, the mobile relay node can be handed over from the eNB1 to the eNB2.

Various mobile relay architectures for supporting the mobile relay node may be proposed. It is natural that all of mobile relay architectures focus on how to provide the RN handover. Nevertheless, it is important to consider the handover for UEs connected to the mobile relay node, analyzing the proposed mobile relay architectures.

FIG. 8 shows an example of a mobile relay node architecture.

Referring to FIG. 8, a mobile relay node has both an eNB network element and a UE network element. That is, the mobile relay node supports eNB functionalities and UE functionalities. Also, a SGW/PGW of the mobile relay node is located at a core network, not in a DeNB supporting the mobile relay node. In this case, the DeNB supporting the mobile relay node cannot know the control signal and the data traffic related to the UEs connected to the mobile relay node. It is because that an S1 interface and the signaling connections are spanning from the SGW/PGW of the mobile relay node to the mobile relay node through the DeNB transparently and a packet destined to the UEs is encapsulated into the stream control transmission protocol/GPRS tunneling protocol (SCTP/GTP) spanned between SGW/PGW of the mobile relay node and the mobile relay node.

FIG. 9 shows another example of a mobile relay node architecture.

Referring to FIG. 9, a mobile relay node has both an eNB network element and a UE network element. That is, the mobile relay node supports eNB functionalities and UE functionalities. Also, a SGW/PGW of the mobile relay node and an optional relay GW are located in a DeNB where the mobile relay node attaches for normal operation to support the mobile relay. In this case, the DeNB supporting the mobile relay node can know the control signal and the data traffic related to the UEs connected to the mobile relay node. It is because that the DeNB is able to interpret the control signal and the data traffic related to the UEs passing through the DeNB.

In LTE Rel-8 UE handover, a target eNB accepts or rejects a UE which attempts a handover according to its current situation, e.g. amounts of assignable resources, the channel environment for a Uu interface, etc, using a UE context. In the same manner, a target DeNB which support a mobile relay node should use a RN context to decide an RN handover. Besides, the target DeNB should support a group mobility for UEs connected to the mobile relay node. When the mobile relay node performs an S1-based handover or an X2-based handover, if the target DeNB has the UE context for the UEs attached to the mobile relay node, it should provide information on assignable resources for UEs to the mobile relay node. However, if the target DeNB has not or cannot have the UE context for the UEs attached to the mobile relay node, it cannot decide accept or reject for handover of each UE. In this case, the mobile relay node should determine handover of UEs.

Accordingly, a method of providing the mobile relay node with information on assignable resources for the mobile relay node may be required.

SUMMARY OF THE INVENTION

The present invention relates to wireless communication, and more particularly, to a method and apparatus for determining handover of user equipments attached to a mobile relay node in a wireless communication system. The present invention provides a method of providing an indication including information on assignable resources to the mobile relay node according to various handover scenarios.

In an aspect, a method for determining, by a mobile relay node (RN), handover of user equipments (UEs) attached to the mobile relay node, which performs a handover procedure from a source donor eNodeB (DeNB) to a target DeNB, in a wireless communication system is provided. The method includes receiving an indication including information on assignable resources for the RN, and determining whether to accept or reject the handover of each UE using the received indication and contexts of the UEs stored in the mobile relay node.

In another aspect, a mobile relay node (RN) in a wireless communication system, the mobile relay node performing a handover procedure from a source donor eNodeB (DeNB) to a target DeNB is provided. The mobile relay node includes a radio frequency (RF) unit, and a processor configured for receiving an indication including information on assignable resources for the RN, and determining whether to accept or reject the handover of each UE using the received indication and contexts of the UEs stored in the mobile relay node.

A mobile relay node can determine service availability for UEs attached to the mobile relay node.

DESCRIPTION OF EXEMPLARY EMBODIMENTS

Figure 1:
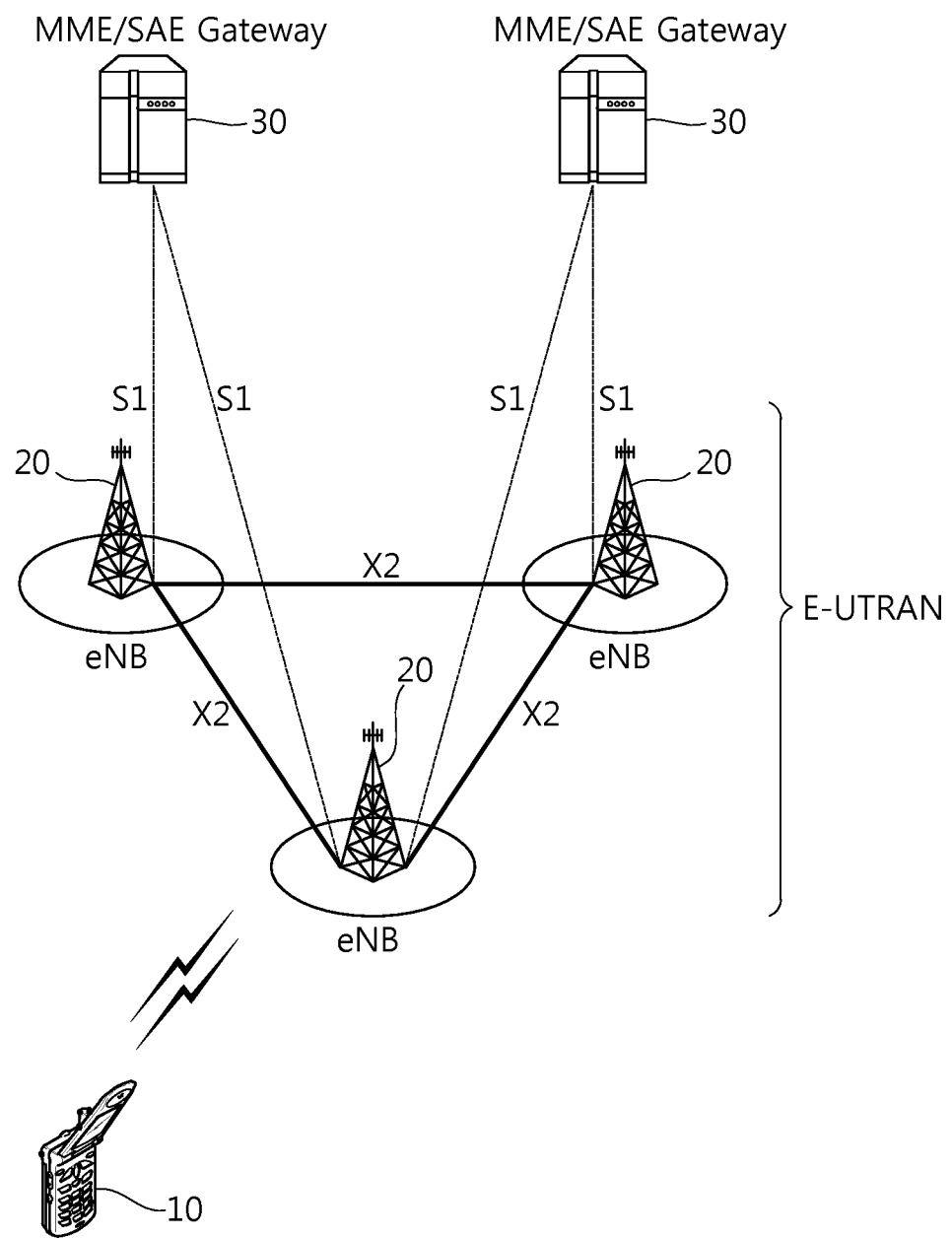
FIG. 1 shows network structure of an evolved universal mobile telecommunication system (E-UMTS).
Figure 2:
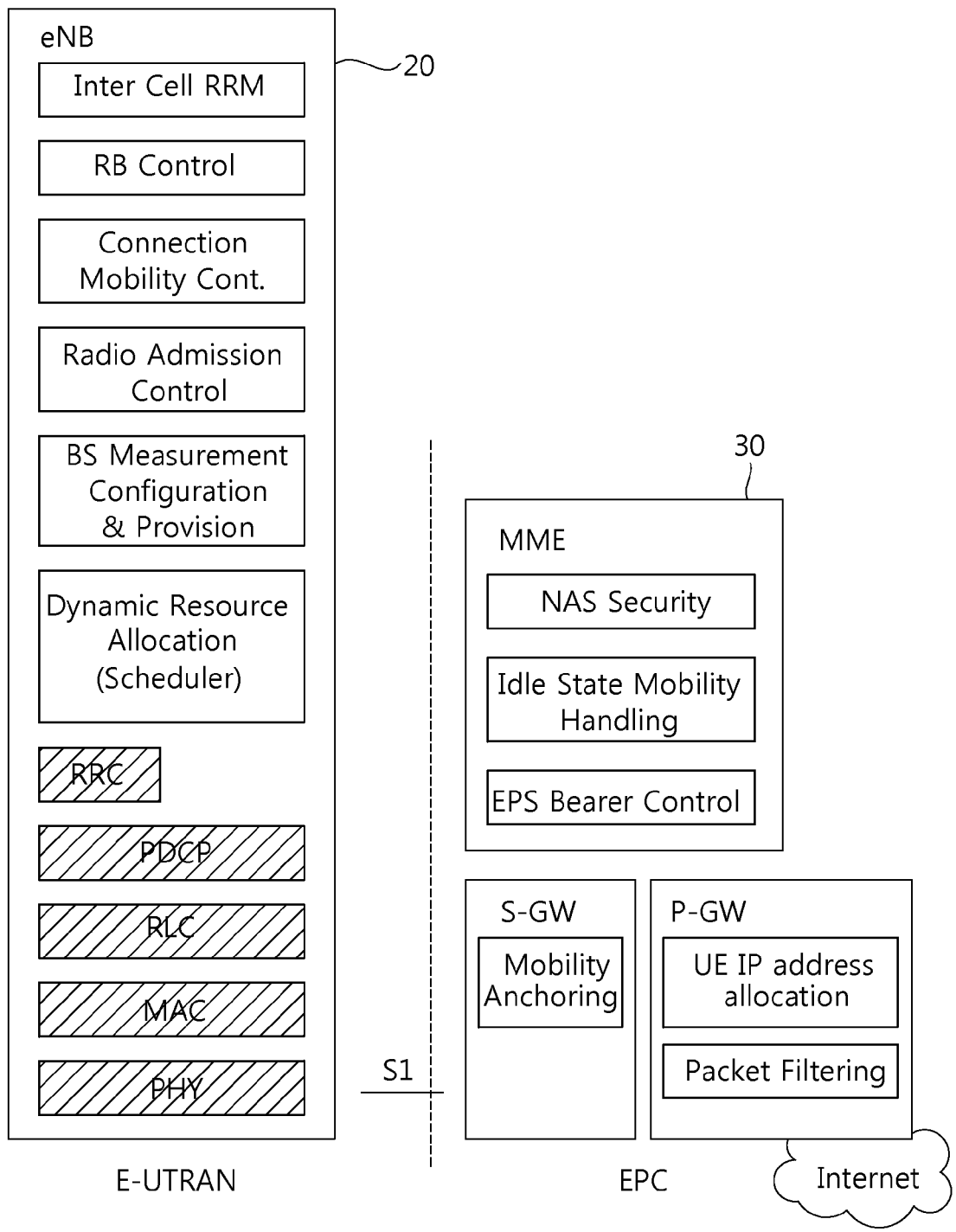
FIG. 2 shows architecture of a typical E-UTRAN and a typical EPC.
Figure 3:
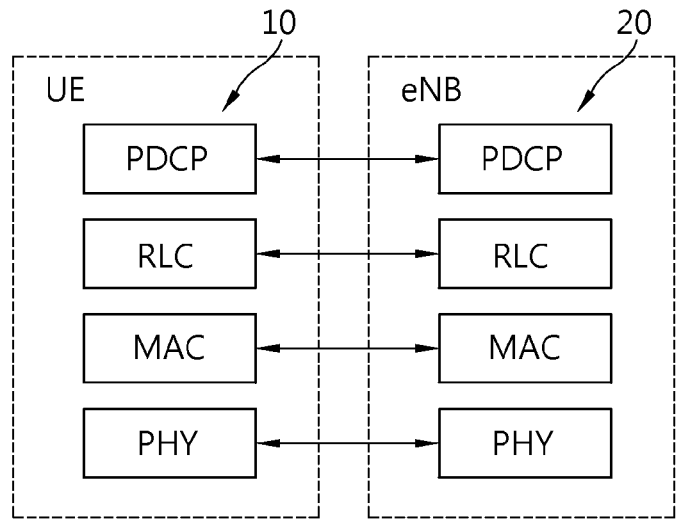
FIG. 3 shows a user-plane protocol and a control-plane protocol stack for the E-UMTS.
Figure 3:
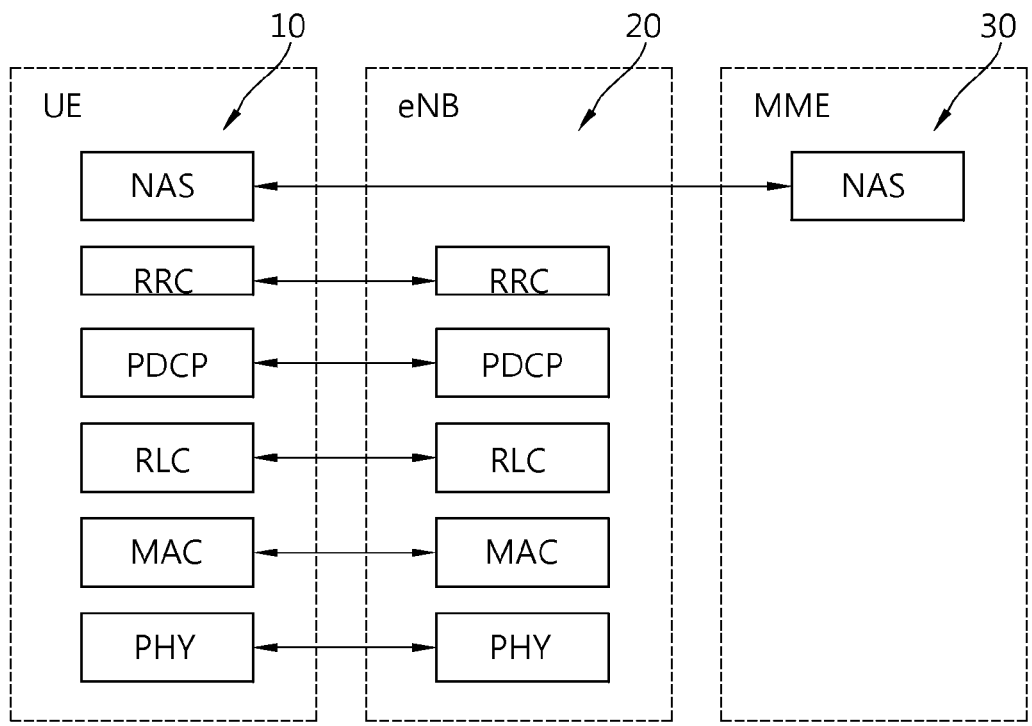
Figure 4:
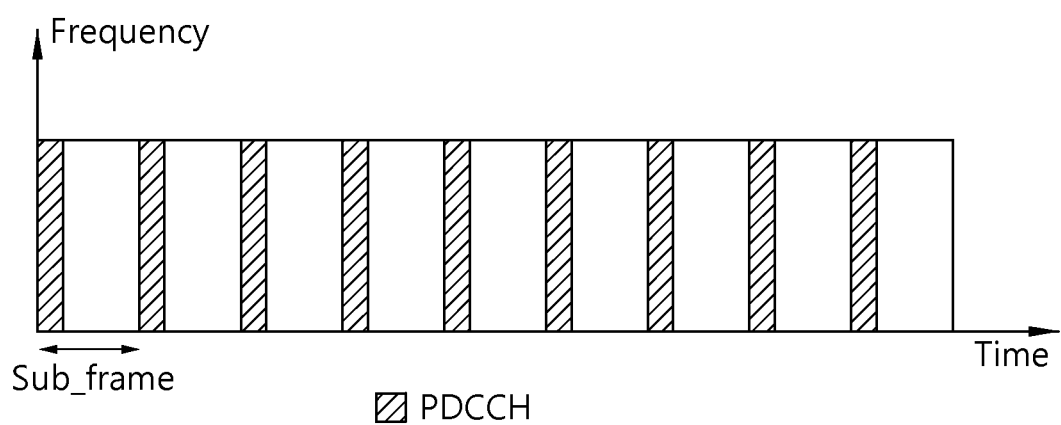
FIG. 4 shows an example of structure of a physical channel.
Figure 5:
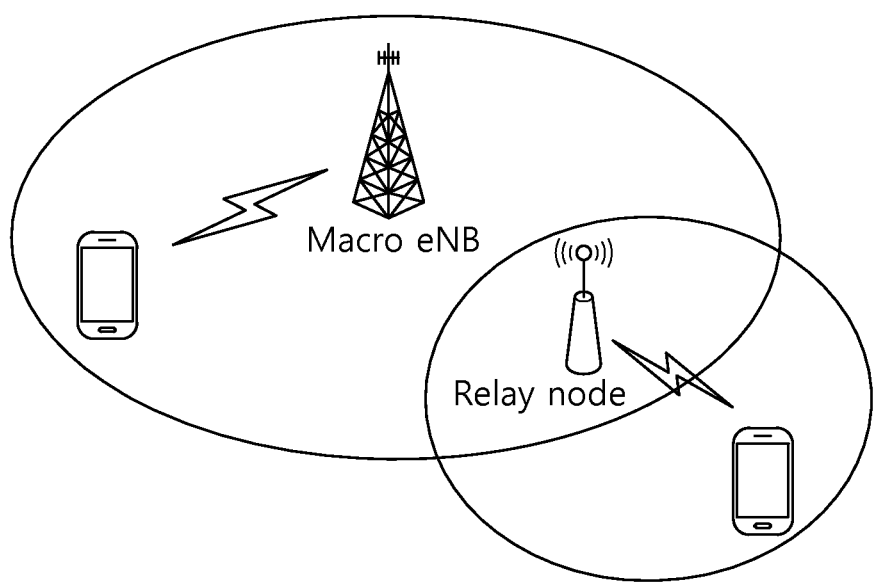
FIG. 5 shows an objective of relay.
Figure 6:
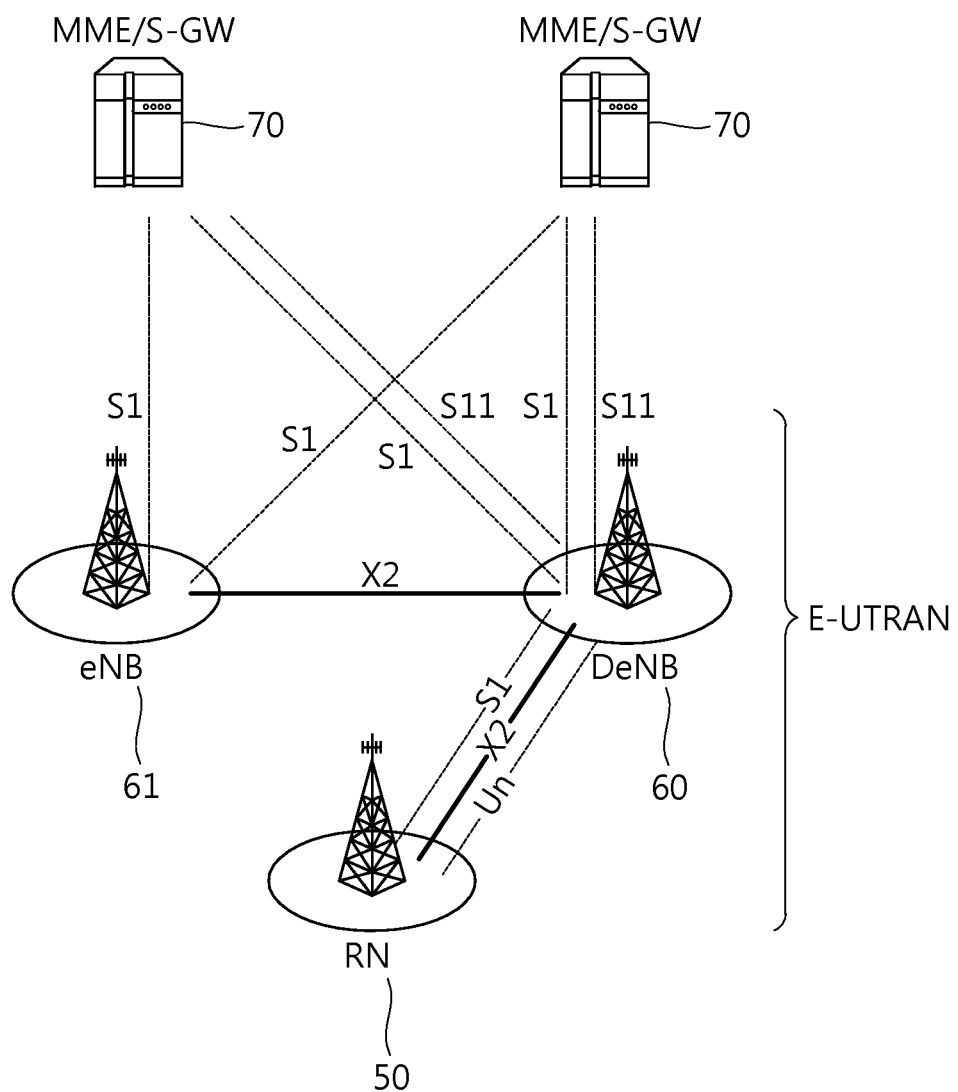
FIG. 6 shows an overall E-UTRAN architecture supporting relay nodes.
Figure 7:
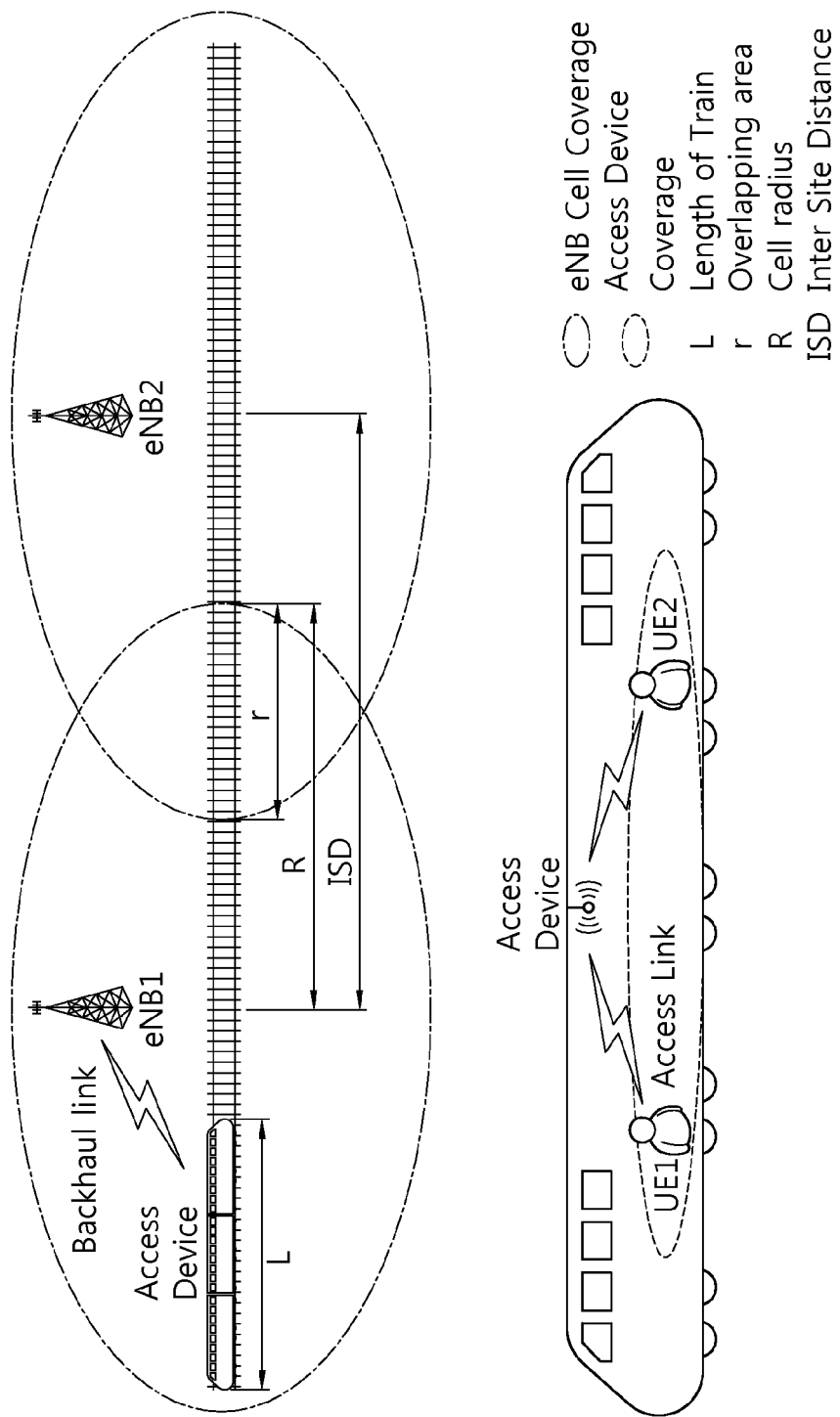
FIG. 7 shows an example of deployments scenario of mobile relay node at a high speed train.
Figure 8:
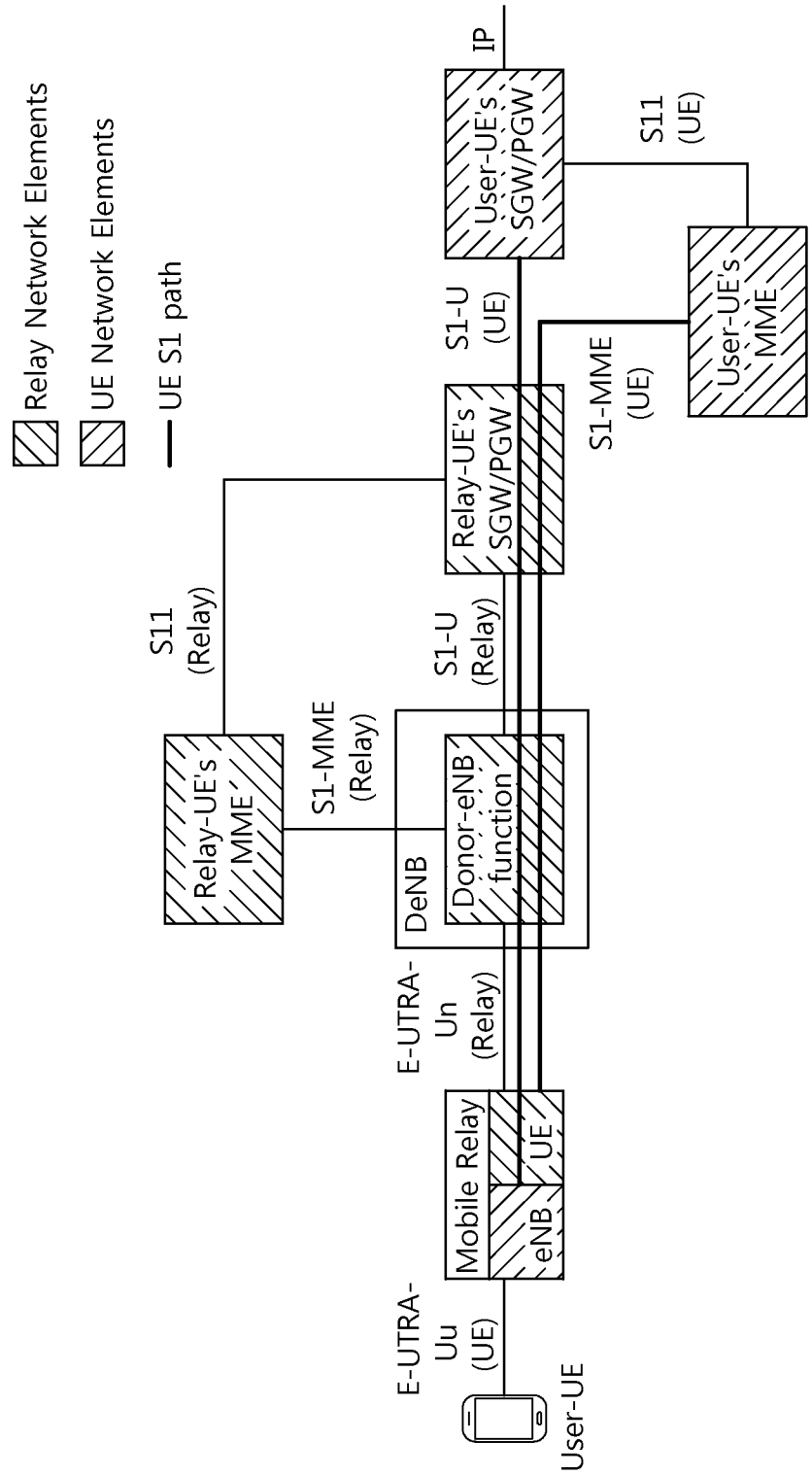
FIG. 8 shows an example of a mobile relay node architecture.
Figure 9:
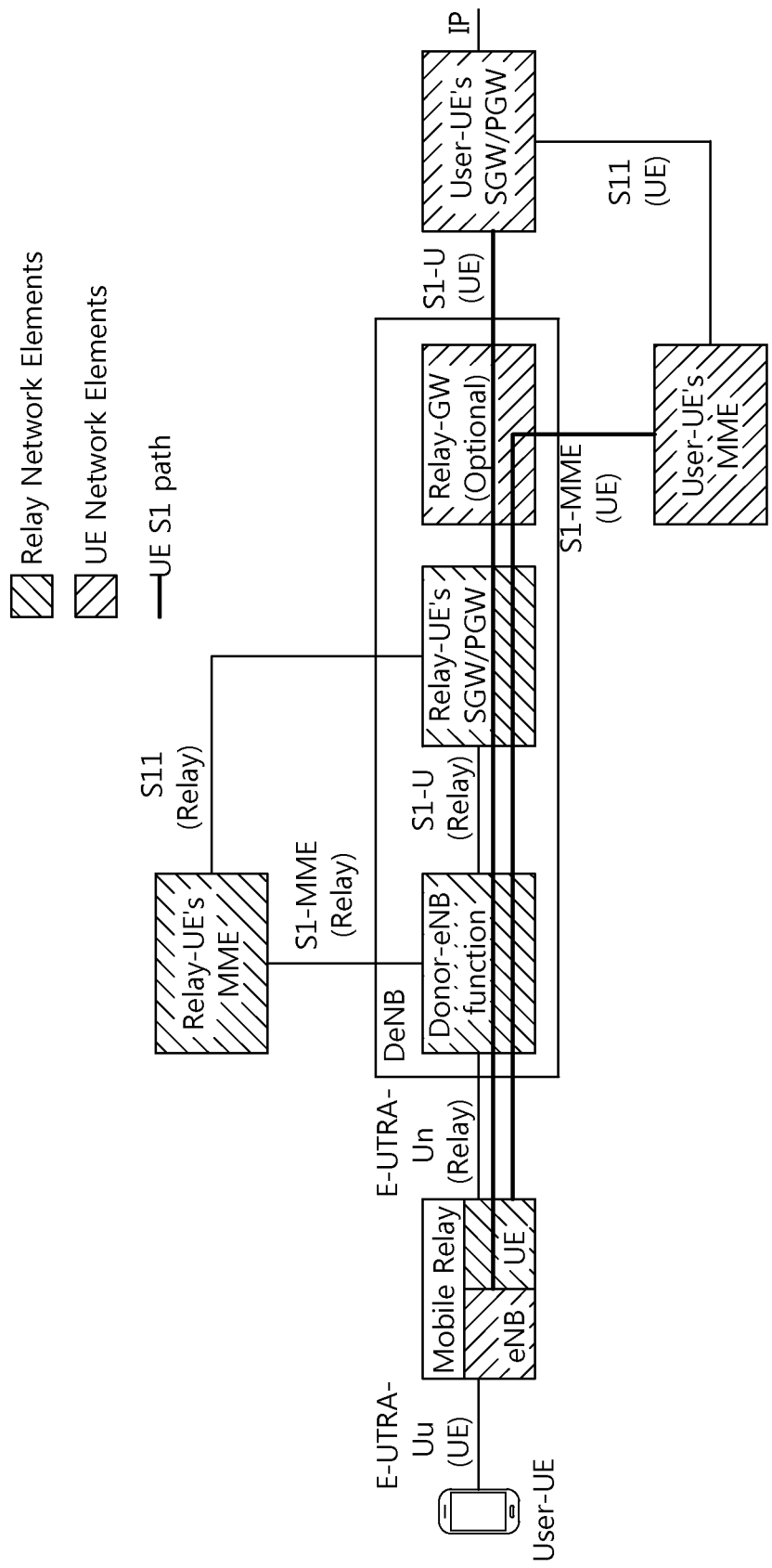
FIG. 9 shows another example of a mobile relay node architecture.

The technology described below can be used in various wireless communication systems such as code division multiple access (CDMA), frequency division multiple access (FDMA), time division multiple access (TDMA), orthogonal frequency division multiple access (OFDMA), single carrier frequency division multiple access (SC-FDMA), etc. The CDMA can be implemented with a radio technology such as universal terrestrial radio access (UTRA) or CDMA-2000. The TDMA can be implemented with a radio technology such as global system for mobile communications (GSM)/general packet ratio service (GPRS)/enhanced data rate for GSM evolution (EDGE). The OFDMA can be implemented with a radio technology such as institute of electrical and electronics engineers (IEEE) 802.11 (Wi-Fi), IEEE 802.16 (WiMAX), IEEE 802-20, evolved UTRA (E-UTRA), etc. IEEE 802.16m is an evolution of IEEE 802.16e, and provides backward compatibility with an IEEE 802.16-based system. The UTRA is a part of a universal mobile telecommunication system (UMTS). 3rd generation partnership project (3GPP) long term evolution (LTE) is a part of an evolved UMTS (E-UMTS) using the E-UTRA. The 3GPP LTE uses the OFDMA in downlink and uses the SC-FDMA in uplink. LTE-advance (LTE-A) is an evolution of the 3GPP LTE.

For clarity, the following description will focus on the LTE-A. However, technical features of the present invention are not limited thereto.

In general, when UE performs handover, a target eNB may accept or reject the UE's handover depending on its current state. At this time, the target eNB may determine the current state using UE context and may accept or reject the UE's handover. The UE context may include an E-UTRAN radio access bearer (E-RAB) identifier (ID) that should be used by the UE and quality of service (QoS)-related parameters of the corresponding E-RAB. The target eNB may determine whether to be able to assign resources to E-RABs having a specific QoS included in the UE context and may accept or reject the UE's handover.

Likewise, in case a mobile relay node performs handover, a target DeNB supporting the mobile relay node may accept or reject the handover of the mobile relay node according to the current state. At this time, the target DeNB may determine the current state using RN context and may accept or reject the mobile relay node's handover. On the other hand, when the mobile relay node performs handover, handover for UEs attached to the mobile relay node is carried out, so that the target DeNB needs to support group mobility for the UEs. Further, the mobile relay node has UE context for the UEs connected thereto.

When the mobile relay node performs S1-based handover or X2-based handover from a source DeNB to a target DeNB, if the target DeNB does not have or cannot have UE contexts of the UEs attached to the mobile relay node, the target DeNB cannot determine whether to accept the handover of the UEs attached to the mobile relay node. If the mobile relay node performs handover to the target DeNB without any measurement, all the UEs attached to the mobile relay node turn into an out-of-service situation as the ongoing service is stopped, thus causing serious service interruption.

Accordingly, when the mobile relay node performs handover to the target DeNB, the mobile relay node needs to be able to determine whether to accept the handover of the UEs connected thereto. Thus, there is a need for a method for providing the mobile relay node information regarding resources that the target DeNB may assign to the mobile relay node.

According to an embodiment of the present invention, when the mobile relay node performs S1-based handover or X2-based handover from the source DeNB to the target DeNB, the source DeNB or target DeNB may transmit an indication including information determined by the target DeNB based on the RN context of the mobile relay node to the mobile relay node by various methods. Receiving the indication, the mobile relay node may determine whether to be able to provide services to a plurality of UEs connected to the mobile relay node based on the UE contexts of the UEs that are possessed by the mobile relay node and information determined by the target DeNB that is included in the indication.

Figure 10:
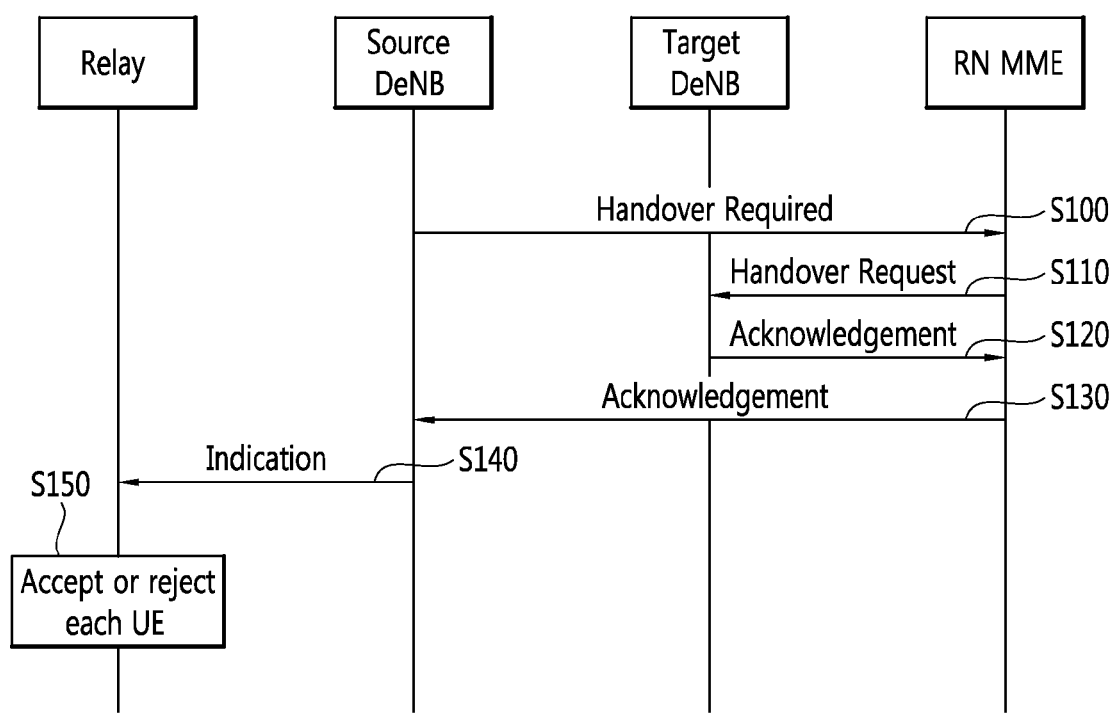
FIG. 10 shows an example of a method of transmitting an indication according to an embodiment of the present invention.

FIG. 10 shows an example of a method of transmitting an indication according to an embodiment of the present invention. The embodiment of FIG. 10 shows an example where the mobile relay node receives an indication from a source DeNB in case of S1-based handover.

Referring to FIG. 10, in step S100, the source DeNB transmits a handover required message including RN context to an RN MME. In step S110, the RN MME transmits the handover request message including the RN context to a target DeNB. The target DeNB may determine resources that may be used by the mobile relay node based on the RN context.

In step S120, the target DeNB transmits an acknowledgement for the handover request message to the RN MME. The acknowledgement may include information for the resources that may be used by the mobile relay node as determined by the target DeNB. In step S130, the RN MME transmits the acknowledgement for the handover required message to the source DeNB. The acknowledgement may include information for resources that may be used by the mobile relay node as determined by the target DeNB.

In step S140, the source DeNB transmits an indication including the information for the resources that may be used by the mobile relay node as determined by the target DeNB to the mobile relay node. In step S150, the mobile relay node may perform mapping on the bearer of each UE and E-RAB allowed to the mobile relay node considering various parameters such as QoS by using the UE context possessed by the mobile relay node and the received indication. Accordingly, the mobile relay node may accept or reject the handover of each UE and may determine whether to be able to provide services to the UEs connected thereto.

Figure 11:
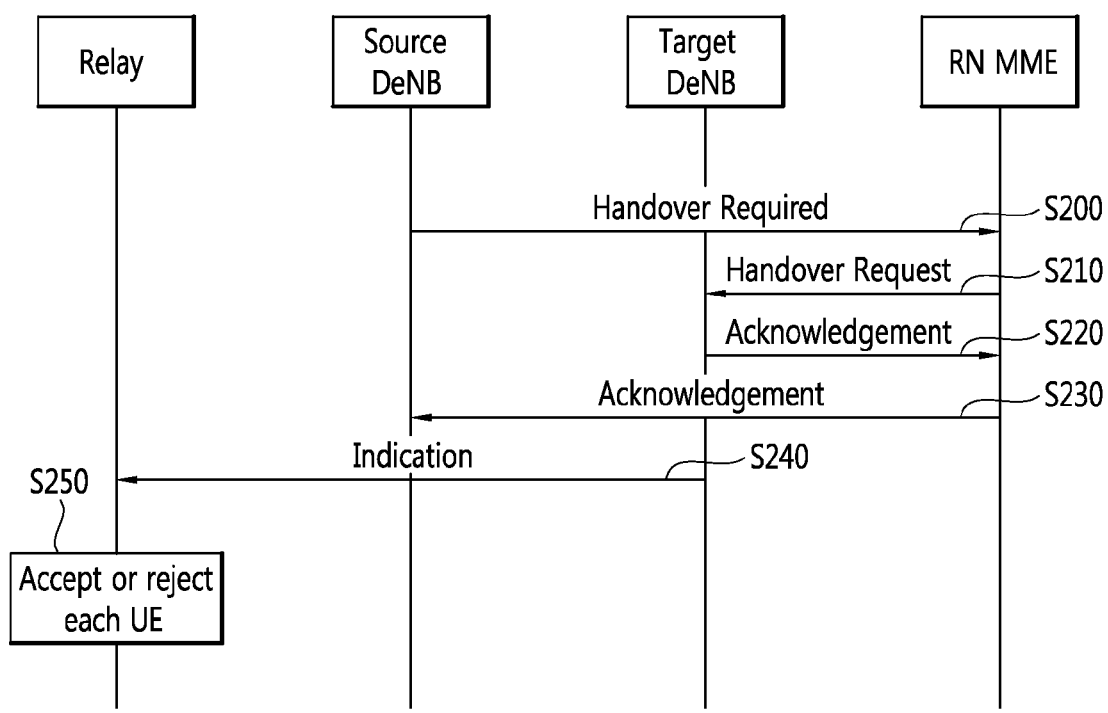
FIG. 11 shows another example of a method of transmitting an indication according to an embodiment of the present invention.

FIG. 11 shows another example of a method of transmitting an indication according to an embodiment of the present invention. The embodiment of FIG. 11 shows an example where the mobile relay node receives an indication from the target DeNB in case of S1-based handover.

Referring to FIG. 11, in step S200, the source DeNB transmits a handover required message including RN context to an RN MME. In step S210, the RN MME transmits a handover request message including the RN context to a target DeNB. The target DeNB may determine resources that may be used by the mobile relay node based on the RN context.

In step S220, the target DeNB transmits an acknowledgement for the handover request message to the RN MME. The acknowledgement may include information for resources that may be used by the mobile relay node as determined by the target DeNB. In step S230, the RN MME transmits an acknowledgement for the handover required message to the source DeNB. The acknowledgement may include information for resources that may be used by the mobile relay node as determined by the target DeNB.

In step S240, the target DeNB transmits an indication including the information for the resources that may be used by the mobile relay node as determined by the target DeNB to the mobile relay node. The target DeNB may transmit the indication to the mobile relay node simultaneously when the RN MME transmits the acknowledgement to the source DeNB or may transmit the indication to the mobile relay node after the source DeNB receives the acknowledgement from the RN MME.

In step S250, the mobile relay node may perform mapping on the bearer of each UE and E-RAB allowed to the mobile relay node considering various parameters such as QoS by using the UE context possessed by the mobile relay node and the received indication. Accordingly, the mobile relay node may accept or reject the handover of each UE and may determine whether to be able to provide services to the UEs connected thereto.

Figure 12:
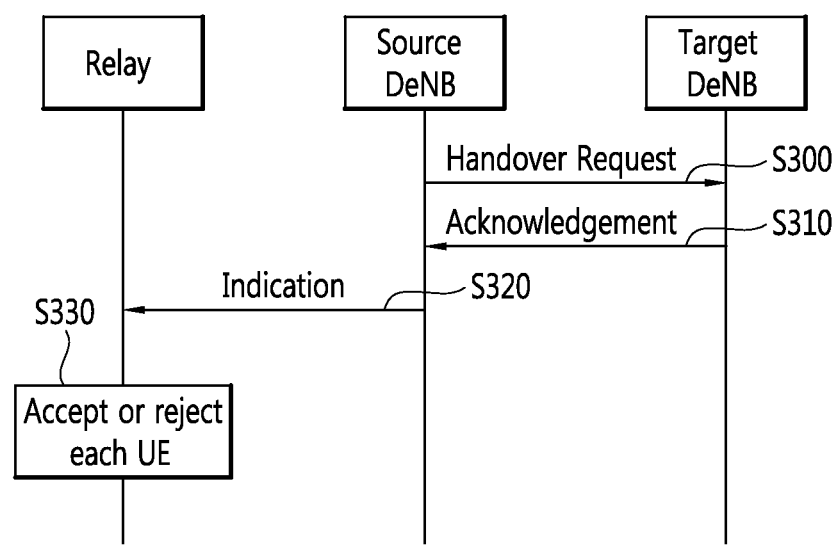
FIG. 12 shows another example of a method of transmitting an indication according to an embodiment of the present invention.

FIG. 12 shows another example of a method of transmitting an indication according to an embodiment of the present invention. The embodiment of FIG. 12 shows an example of the mobile relay node receiving an indication from the source DeNB in case of X2-based handover.

Referring to FIG. 12, in step S300, the source DeNB transmits a handover request message including RN context to a target DeNB. The target DeNB may determine resources that may be used by the mobile relay node based on the RN context. In step S310, the target DeNB transmits an acknowledgement for the handover request message to the source DeNB. The acknowledgement may include information for resources that may be used by the mobile relay node as determined by the target DeNB.

In step S320, the source DeNB transmits an indication including the information for the resources that may be used by the mobile relay node as determined by the target DeNB to the mobile relay node. In step S330, the mobile relay node may perform mapping on the bearer of each UE and E-RAB allowed to the mobile relay node considering various parameters such as QoS by using the UE context possessed by the mobile relay node and the received indication. Accordingly, the mobile relay node may accept or reject the handover of each UE and may determine whether to be able to provide services to the UEs connected thereto.

Figure 13:
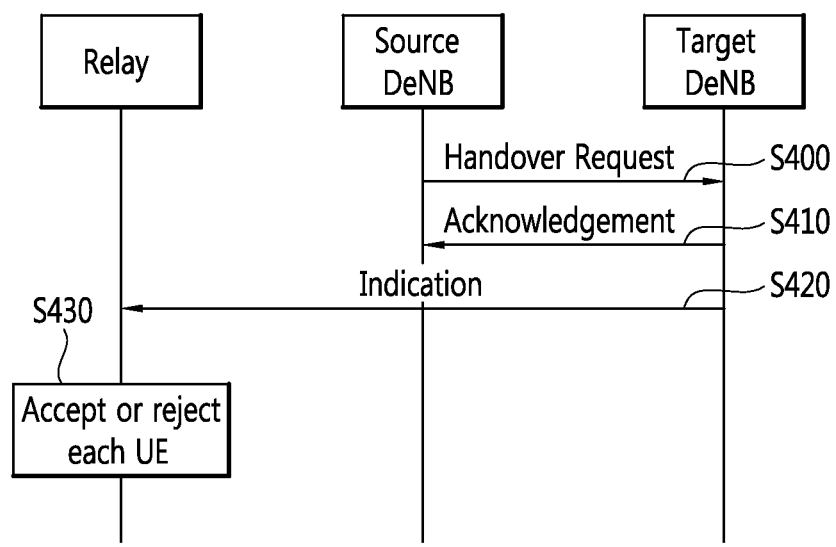
FIG. 13 shows another example of a suggested method of transmitting an indication according to an embodiment of the present invention.

FIG. 13 shows another example of a suggested method of transmitting an indication according to an embodiment of the present invention. The embodiment of FIG. 13 shows an example of the mobile relay node receiving an indication from the target DeNB in case of X2-based handover.

Referring to FIG. 13, in step S400, the source DeNB transmits a handover request message including RN context to a target DeNB. The target DeNB may determine resources that may be used by the mobile relay node based on the RN context. In step S410, the target DeNB transmits an acknowledgement for the handover request message to the source DeNB. The acknowledgement may include information for resources that may be used by the mobile relay node as determined by the target DeNB.

In step S420, the target DeNB transmits an indication including the information for the resources that may be used by the mobile relay node as determined on its own to the mobile relay node. The target DeNB may transmit the indication to the mobile relay node simultaneously when sending the acknowledgement to the source DeNB or may transmit the indication to the mobile relay node after the source DeNB receives the acknowledgement from the target DeNB.

In step S430, the mobile relay node may perform mapping on the bearer of each UE and E-RAB allowed to the mobile relay node considering various parameters such as QoS by using the UE context possessed by the mobile relay node and the received indication. Accordingly, the mobile relay node may accept or reject the handover of each UE and may determine whether to be able to provide services to the UEs connected thereto.

Figure 14:
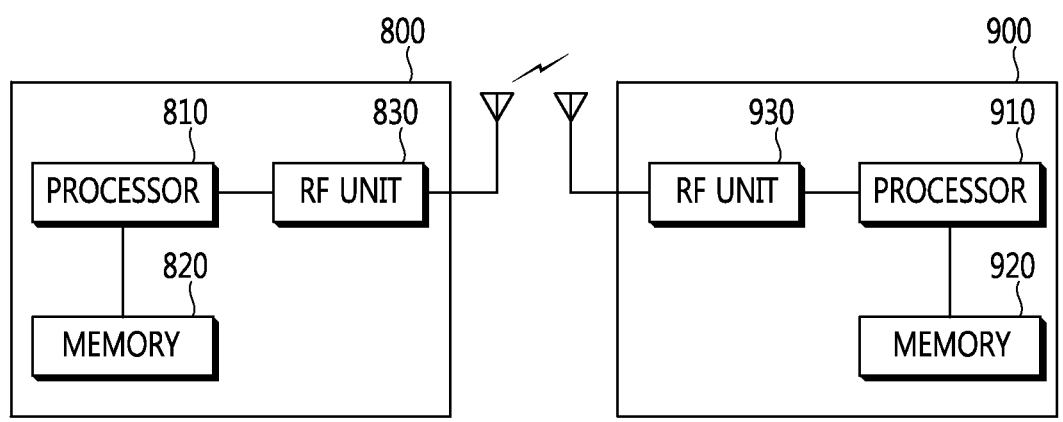
FIG. 14 is a block diagram showing wireless communication system to implement an embodiment of the present invention.

FIG. 14 is a block diagram showing wireless communication system to implement an embodiment of the present invention.

A mobile relay node 800 includes a processor 810, a memory 820, and an RF (radio frequency) unit 830. The processor 810 may be configured to implement proposed functions, procedures, and/or methods in this description. Layers of the radio interface protocol may be implemented in the processor 810. The memory 820 is operatively coupled with the processor 810 and stores a variety of information to operate the processor 810. The RF unit 830 is operatively coupled with the processor 810, and transmits and/or receives a radio signal.

A DeNB 900 may include a processor 910, a memory 920 and a RF unit 930. The processor 910 may be configured to implement proposed functions, procedures and/or methods described in this description. Layers of the radio interface protocol may be implemented in the processor 910. The memory 920 is operatively coupled with the processor 910 and stores a variety of information to operate the processor 910. The RF unit 930 is operatively coupled with the processor 910, and transmits and/or receives a radio signal.

The processors 810, 910 may include application-specific integrated circuit (ASIC), other chipset, logic circuit and/or data processing device. The memories 820, 920 may include read-only memory (ROM), random access memory (RAM), flash memory, memory card, storage medium and/or other storage device. The RF units 830, 930 may include baseband circuitry to process radio frequency signals. When the embodiments are implemented in software, the techniques described herein can be implemented with modules (e.g., procedures, functions, and so on) that perform the functions described herein. The modules can be stored in memories 820, 920 and executed by processors 810, 910. The memories 820, 920 can be implemented within the processors 810, 910 or external to the processors 810, 910 in which case those can be communicatively coupled to the processors 810, 910 via various means as is known in the art.

In view of the exemplary systems described herein, methodologies that may be implemented in accordance with the disclosed subject matter have been described with reference to several flow diagrams. While for purposed of simplicity, the methodologies are shown and described as a series of steps or blocks, it is to be understood and appreciated that the claimed subject matter is not limited by the order of the steps or blocks, as some steps may occur in different orders or concurrently with other steps from what is depicted and described herein. Moreover, one skilled in the art would understand that the steps illustrated in the flow diagram are not exclusive and other steps may be included or one or more of the steps in the example flow diagram may be deleted without affecting the scope and spirit of the present disclosure.

What is claimed is:

1. A method for determining, by a mobile relay node (RN), handover of user equipments (UEs) attached to the mobile relay node, which performs a handover procedure from a source donor eNodeB (DeNB) to a target DeNB, in a wireless communication system, the method comprising:
   receiving, by the RN, an indication including information on assignable resources for the RN;
   mapping, by the RN, an evolved UMTS terrestrial radio access network (E-UTRAN) radio access bearer (E-RAB) allowed to the RN onto a bearer of each UE connected to the RN considering quality of service (QoS) based on the indication;
   determining, by the RN, whether it is possible to provide services to the each UE based on the mapping; and determining, by the RN, whether to accept or reject the handover of the each UE based on the determination and contexts of the UEs stored in the RN, wherein, if it is impossible to provide service to the each UE based on the mapping, the handover of the each UE is rejected by the RN.

2. The method of claim 1, wherein the indication is received from the source DeNB.

3. The method of claim 1, wherein the indication is received from the target DeNB.

4. The method of claim 3, wherein the indication is transmitted by the target DeNB when an RN mobility management entity (MME) transmits an acknowledgement to a handover required message to the source DeNB.

5. The method of claim 3, wherein the indication is transmitted by the target DeNB after the source DeNB receives an acknowledgement to a handover required message from an RN MME.

6. The method of claim 1, wherein the handover procedure is an S1-based handover procedure, which performs the handover procedure via an S1 interface connecting a mobility management entity (MME) and eNodeBs.

7. The method of claim 1, wherein the handover procedure is an X2-based handover procedure, which performs the handover procedure via an X2 interface connecting an eNodeB and a neighboring eNodeB.

8. The method of claim 1, wherein the assignable resources for the RN are determined by the target DeNB using a context of the RN.

9. A mobile relay node (RN) in a wireless communication system, the mobile relay node performing a handover procedure from a source donor eNodeB (DeNB) to a target DeNB, the mobile relay node comprising:

a radio frequency (RF) unit; and a processor operatively coupled to the RF unit, wherein the processor is configured to:

receive an indication including information on assignable resources for the RN;

map an evolved UMTS terrestrial radio access network (E-UTRAN) radio access bearer (E-RAB) allowed to the RN onto a bearer of each UE connected to the RN considering quality of service (QoS) based on the indication;

determine whether it is possible to provide services to the each UE based on the mapping; and determine whether to accept or reject the handover of the each UE based on the determination and contexts of the UEs stored in the RN, wherein, if it is impossible to provide service to the each UE based on the mapping, the handover of the each UE is rejected by the RN.

10. The mobile relay node of claim 9, wherein the indication is received from the source DeNB.

11. The mobile relay node of claim 9, wherein the indication is received from the target DeNB.

12. The mobile relay node of claim 9, wherein the handover procedure is an S1-based handover procedure, which performs the handover procedure via an S1 interface connecting a mobility management entity (MME) and eNodeBs.

13. The mobile relay node of claim 9, wherein the handover procedure is an X2-based handover procedure, which performs the handover procedure via an X2 interface connecting an eNodeB and a neighboring eNodeB.

* * * * *